(12) United States Patent
Kim et al.

(10) Patent No.: US 9,250,539 B2
(45) Date of Patent: Feb. 2, 2016

(54) BLIND, EXPOSURE APPARATUS HAVING THE BLIND AND METHOD OF DRIVING THE EXPOSURE APPARATUS

(75) Inventors: Chang-Hoon Kim, Asan-si (KR);
Hong-Suk Yoo, Anyang-si (KR);
Kab-Jong Seo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 868 days.

(21) Appl. No.: 13/438,389

(22) Filed: Apr. 3, 2012
(Under 37 CFR 1.47)

(65) Prior Publication Data
US 2013/0088700 A1      Apr. 11, 2013

(30) Foreign Application Priority Data
Apr. 5, 2011 (KR) .......... 10-2011-0031140

(51) Int. Cl.
G03B 27/42 (2006.01)
G03F 7/20 (2006.01)

(52) U.S. Cl.
CPC .......... *G03F 7/7055* (2013.01); *G03F 7/70066* (2013.01)

(58) Field of Classification Search
CPC ............ G03F 7/70191; G03F 7/70141; G03F 7/70258; G03F 1/38; G03F 7/70066; G03F 9/7088; G02B 7/005; G02B 27/281; G02B 27/0933
USPC ....................................... 355/53, 67
See application file for complete search history.

(56) References Cited

U.S. PATENT DOCUMENTS

2001/0008442 A1* 7/2001 Miyake ........................ 355/53
2009/0073404 A1* 3/2009 Muramatsu .................... 355/53

* cited by examiner

*Primary Examiner* — Mesfin T Asfaw
(74) *Attorney, Agent, or Firm* — H.C. Park Associates, PLC (57) ABSTRACT

An exposure apparatus includes a light source, a mask and a blind. The light source is disposed over a substrate. The light source cyclically radiates light. The mask is disposed between the light source and the substrate. The mask includes an exposure region and a peripheral region. The peripheral region surrounds the exposure region. A pattern is formed in the exposure region. A plurality of first alignment marks is disposed in the peripheral region. The blind is disposed between the light source and the mask. The blind includes a blocking plate and an adjusting part. The blocking part may move across the substrate. The blocking plate includes second alignment marks disposed at end portions of the blocking plate, opposite to each other. The adjusting part adjusts a position of the blocking plate.

10 Claims, 5 Drawing Sheets

BLIND, EXPOSURE APPARATUS HAVING THE BLIND AND METHOD OF DRIVING THE EXPOSURE APPARATUS

CROSS-REFERENCE TO RELATED APPLICATION

This application claims priority from and the benefit of Korean Patent Application No. 2011-31140, filed on Apr. 5, 2011, which is hereby incorporated by reference for all purposes as if fully set forth herein.

BACKGROUND OF THE INVENTION

1. Field of the Invention

Exemplary embodiments of the present invention relate to a blind, an exposure apparatus having the blind and a method of driving the exposure apparatus.

2. Discussion of the Background

Generally, in an exposure operation used to manufacture a thin film transistor ("TFT") substrate and/or a color filter substrate included in a display apparatus includes an operation of light radiated on a substrate, on which a photoresist layer is coated, through a photo mask having a specific pattern. To decrease a cost associated with manufacturing the liquid crystal display apparatus in the exposure operation, a size of a mother substrate is increased, to allow more liquid crystal display panels to be formed in a single manufacturing process. However, due to the increase of the size of the mother substrate, the size of the photo mask may also be increased, thereby increasing the cost of manufacturing the liquid crystal display apparatus.

Thus, a small mask type exposure process may be employed in order to decrease the size of the photo mask. The small mask type exposure process involves exposing the substrate using a plurality of exposures and a plurality of small photo masks that are moved with respect to the substrate.

The substrate has an exposed area and a non-exposed area. The exposure includes a blind for blocking an exposure window of the photo mask to prevent the non-exposed area from being exposed. The light radiated on the substrate in a direction perpendicular to the substrate using various optical systems. However, perfectly perpendicular light may be difficult to achieve. Thus, the light radiated on the substrate has dispersion with respect to the direction perpendicular to the substrate at a specific angle. Due to the dispersion of light, the light may not be blocked at a boundary line of the blind. A gray area may be formed around the boundary line of the blind, due to a reduction in the amount of radiated light. A pattern formed by the gray area is called a tail pattern.

Generally, a dummy pattern is formed in the non-exposed area of the substrate. If the blind is combined with the exposure apparatus, a position of the blind may not be precisely controlled, resulting in tail patterns to be formed for each blind. Thus, the tail pattern and the dummy pattern may overlap. Accordingly, a gap between cells on the substrate may increase, so that a stain may be displayed to a user, thereby reducing the display quality of the display panel.

The above information disclosed in this Background section is only for enhancement of understanding of the background of the invention and therefore it may contain information that does not form any part of the prior art.

SUMMARY OF THE INVENTION

Exemplary embodiments of the present invention provide a blind, an exposure apparatus, and a method for driving the exposure apparatus, while reducing stains displayed to a user.

Additional features of the invention will be set forth in the description which follows, and in part will be apparent from the description, or may be learned by practice of the invention.

An exemplary embodiment of the present invention discloses a blind including: a blocking plate to block light of an exposure process, the blocking plate comprising a first alignment mark disposed at a first end of the blocking plate, and a second alignment mark disposed at an opposing second end portion of the blocking plate; and a first adjusting part disposed on the first end of the blocking plate to adjust the position of the blocking plate.

An exemplary embodiment of the present invention also discloses an exposure apparatus, the apparatus including: a light source to cyclically radiate light onto a substrate; a mask disposed between the light source and the substrate, the mask comprising a patterned exposure region, a peripheral region surrounding the exposure region, and first alignment marks disposed on the peripheral region; and a blind disposed between the light source and the mask, the blind comprising a blocking plate, and an adjusting part to adjust the position of the blocking plate, wherein the blocking plate moves from a first end of the substrate to an opposing second end of the substrate and comprises second alignment marks disposed at opposing first and second ends of the blocking plate.

An exemplary embodiment of the present invention also discloses a method for driving an exposure apparatus, the method including: overlapping a mask and a blocking plate over a substrate; determining the alignment of the blocking plate and the mask, by comparing the relative positions of first alignment marks disposed on the mask and second alignment marks disposed on the blocking plate; adjusting the blocking plate based on the comparison; and moving the blocking plate to block a non-exposed area of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
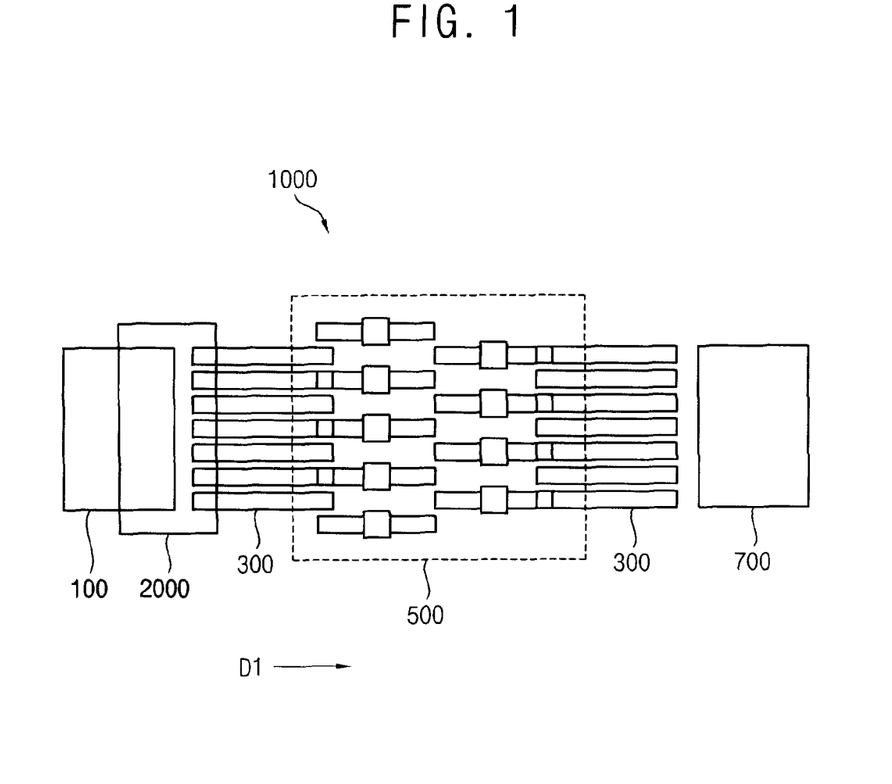
FIG. 1 is a plan view illustrating an exposure apparatus, according to an exemplary embodiment of the present invention.

FIG. 1 is a plan view illustrating an exposure apparatus 1000, according to an exemplary embodiment of the present invention.

Referring to FIG. 1, the exposure apparatus 1000 includes a loading part 100, a stage 300, an exposure processing part 500 and an unloading part 700.

The loading part 100 loads a substrate 2000 from outside of the exposure apparatus 1000. Once loaded, the substrate 2000 is exposed by the exposure apparatus 1000.

The stage 300 transfers the substrate 2000 from the loading part 100 to the exposure processing part 500 along a first direction D1, and transfers the substrate 2000 from the exposure processing part 500 to the unloading part 700. The stage 300 extends along the first direction D1.

The substrate 2000 may be exposed by a scan-type or a step-type exposure method. In scan-type method, the stage 300 may continuously transfer the substrate 2000. In step-type method, the stage 300 may discontinuously transfer the substrate 2000 with various repetitions of moving and stopping while transferring the substrate 2000. If a strip pattern is to be formed on the substrate 2000, the scan-type exposing may be applied. If an island pattern is to be formed on the substrate 2000, the step-type exposing may be applied.

The stage 300 may use a magnetic levitation method to transfer the substrate 2000. The exposure processing part 500 radiates the light onto the substrate 2000, after being transferred from the stage 300, to form a pattern on the substrate 2000. The exposure processing part 500, which may be fixed, exposes the substrate 2000, while the substrate 2000 is moving in the first direction D1, so that the pattern on the substrate 2000 may be formed in a direction opposite of the first direction D1.

The exposure processing part 500 may include a plurality of exposure modules. The exposure modules may be disposed in a plurality of columns. For example, the exposure modules are disposed in two columns. The exposure modules in a first column may be alternately disposed with the exposure modules in a second column so that the substrate 2000 may be entirely exposed by the exposure modules. As shown in FIG. 1, five exposure modules may be disposed in the first column, and four exposure modules may be disposed in the second column, and the five exposure modules may have a corresponding one of the four exposure modules in between them. After the substrate 2000 is exposed by the exposure processing part 500, the unloading part 700 unloads the substrate 2000, on which the pattern is formed, thereby locating the substrate 2000 outside of the exposure apparatus 1000.

The substrate 2000 may be a thin film transistor ("TFT") substrate or a color filter substrate, which are elements of a liquid crystal display ("LCD") panel of an LCD apparatus. The TFT substrate may include TFTs disposed in a matrix pattern on a glass substrate, with the TFTs serving as a switching element. The color filter substrate may include red, green and blue pixels.

Figure 2:
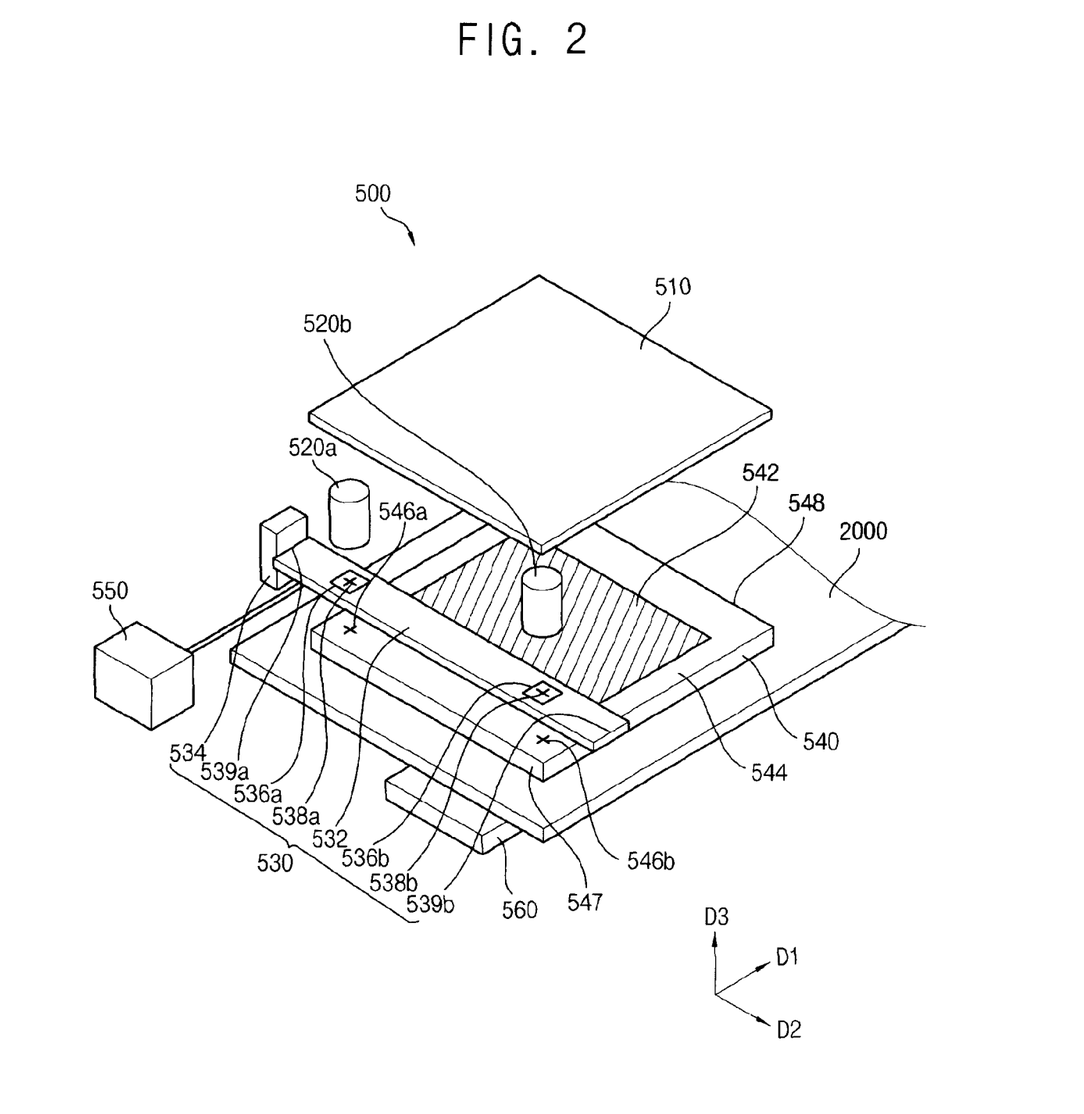
FIG. 2 is a diagram illustrating an exposure processing part, according to an exemplary embodiment of the present invention.
Figure 3:
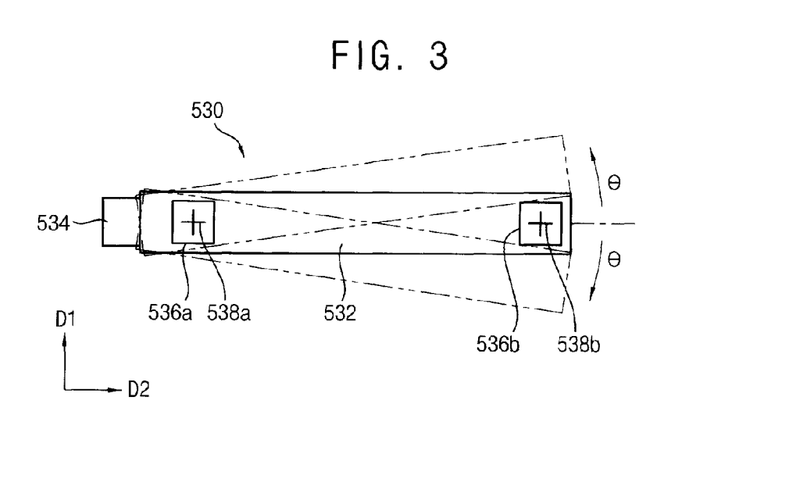
FIG. 3 is a plan view illustrating a blind, according to an exemplary embodiment of the present invention.

FIG. 2 is a diagram illustrating an exposure processing part 500, according to an exemplary embodiment. FIG. 3 is a plan view illustrating a blind 530, according to an exemplary embodiment.

Referring to FIGS. 2 and 3, the exposure processing part 500 includes a light source 510, a plurality of first image processors 520a and 520b, the blind 530, a mask 540, a driver 550, and a second image processor 560. The exposure processing part 500 may include a plurality of exposure modules. Each of the exposure modules may include the light source 510, the first image processors 520a and 520b, the blind 530, the mask 540, the driver 550, and the second image processor 560.

The light source 510 is disposed over the blind 530 and the mask 540 to radiate light toward the mask 540. The light may be radiated substantially perpendicular to a plane of the mask 540.

The light source 510 may include a lamp (not shown) and/or a laser oscillator (not shown). For example, the light source 510 may include a mercury lamp and/or an nd-YAG laser oscillator. The light source 510 radiates the light cyclically. For example, a frequency of the light source 510 may be about 50 Hz, and the light radiating cycle may be about 20 msec. The laser oscillation period may be short in the light radiating cycle. Thus, a non-oscillation period of the laser may be about 20 msec. Herein, a specific frequency and cycle are provided; however, aspects of the present disclosure are not limited thereto.

The mask 540 is disposed over the substrate 2000, and is disposed under the blind 530. The mask 540 includes an exposure region 542 to transmit the light radiated from the light source 510, and a peripheral region 544 surrounding the exposure region 542. A pattern is formed in the exposure region 542 by selectively transmitting the light radiated from the light source 510. The mask 540 may include various patterns, such as a rectangular pixel, a zigzag shaped pixel, or the like. The exposure region 542 may have a rectangular shape.

The mask 540 may be used to form a color filter substrate. The color filter substrate may have a first color pixel that may be red, a second color pixel that may be green, and a third color pixel that may be blue. A first color photoresist layer, a second color photoresist layer and a third color photoresist layer may be patterned to form the first, second and third color pixels, respectively. Alternatively, the mask 540 may be used to form the TFT substrate.

The mask 540 includes a plurality of first alignment marks 546a and 546b disposed on the peripheral region 544. For example, the blind 530 is moved from a first side 547 of the mask 540 to a second side 548 of the mask 540, to block a non-exposed area of the substrate 2000. The first alignment marks 546a and 546b are disposed adjacent to the first side 547 of the mask 540. For example, the first alignment marks 546a and 546b are disposed on the peripheral region 544, adjacent to the first portion 547. The first alignment marks 546a and 546b are disposed opposite to each other in a second direction D2, adjacent to the first side 547, and may correspond with second alignment marks 538a and 538b disposed on a blocking plate 532 of the blind 530.

The blind 530 is disposed over the exposure region 542 of the mask 540 so that the blind 530 blocks the light radiated from the light source 510 from passing through the mask 540. Thus, the blind 530 may be used to prevent light from irradiating the non-exposed area of the substrate 2000.

The blind 530 includes a blocking plate 532 and an adjusting part 534. The adjusting part 534 adjusts a position of the blocking plate 532. The blocking plate 532 includes the second alignment marks 538a and 538b. The second alignment marks 538a and 538b may be disposed opposite to each other, in the second direction D2, adjacent to opposing ends of the blocking plate 532.

The blocking plate 532 may include a plurality of transparent window parts 536a and 536b. Two transparent window parts 536a and 536b are shown in FIGS. 2 and 3; however, the present disclosure is not limited thereto. The second alignment marks 538a and 538b may be disposed in the window parts 536a and 536b. The window parts are disposed opposite to each other, in the second direction D2, at an end of the blocking plate 532. The second alignment marks 538a and 538b may be respectively disposed in the window parts 536a and 536b. The blocking plate 532 extends in the second direction D2. The blocking plate 532 may be moved over the substrate 2000 in the first direction D1. The blocking plate 532 may have a rectangular shape. The blocking plate 532 may include a carbon fiber material.

The first alignment marks 546a and 546b and the second alignment marks 538a and 538b set an alignment position of the mask 540 and the blocking plates 432, to aid in the operation of an exposure process. To operate the exposure process, the mask 540 and the blocking plate 432 are located in the alignment position. The first alignment marks 546a and 546b and the second alignment marks 538a and 538b overlap with each other, in the alignment position. In the alignment position, the first align marks 546a and 546b and the second align marks 538a and 538b are overlapped with each other in a third direction D3, which is perpendicular to the substrate 2000.

Although only one blocking plate 532 is shown in FIGS. 2 and 3, the blind 530 may include a plurality of the blocking plates 532. For example, the number of the blocking plates 532 may be six; however, the number is not limited hereto. The blocking plates 532 may be disposed in various planes that may be different from each other. The blocking plates 532 may be controlled to move independently from each other.

The adjusting part 534 is fixed at a first end portion 539a of the blocking plate 532. The adjusting part 534 adjusts a position of the blocking plate 532. For example, the adjusting part 534 adjusts a tiling angle of the blocking plate 532, by rotating the blocking plate 532 by a first angle(θ) with respect to the first end portion 539a. If the blocking plate 532 is perpendicular to the first direction D1 at the alignment position, the blocking plate 532 may block the light radiated from the light source 510 based on an allowable error range, thereby minimizing the appearance of tail patterns on the substrate 2000. In addition, an overlap of a dummy pattern with the tail pattern on the substrate 2000 may be prevented. However, before the exposure process, the blocking plate 532 may be inclined in the first direction D1. If the blocking plate 532 is inclined, a range of the tail pattern may be increased and the dummy pattern and the tail pattern may be overlapped with each other. Accordingly, a gap between cells on the substrate 2000 may be increased, causing a stain to be displayed to a user.

As explained above, the adjusting part 534 rotates the blocking plate 532 by the first angle(θ) with respect to the first end portion 539a, to a position in which the adjusting part 534 is disposed to overlap the first alignment marks 546a and 546b with the second alignment marks 538a and 538b. Accordingly, the tilting angle of the blocking plate 532 is adjusted to be in a desired direction, thereby causing the difference of positions of the tail patterns on the substrate 2000 to be minimized. For the purpose of this disclosure, the desired direction may correspond to the direction corresponding to a direction of the blocking plate 532 so that the blocking plate 532 and the mask 540 are substantially aligned with each other.

The driver 550 includes a plurality of motors (not shown). The driver 550 is connected to the blocking plate 532. The driver 550 may be connected to the blocking plate 532 through a chain. Although not shown in figures, the blocking plate 532 may be moved on a guide rail.

The driver 550 moves the blocking plate 532 in the first direction D1 in response to a motor control signal received from outside. The driver 550 may return the blocking plate 532 by moving the blocking plate 532 in the second direction D2.

The first image processors 520a and 520b are disposed over the blind 530, with the blind 530 being in between the first image processors 520a and 520b and the mask 540. The first image processors 520a and 520b determine whether the second alignment marks 538a and 538b of the blocking plate 532 overlap the first alignment marks 546a and 546b. The first image processors 520a and 520b are respectively disposed over the end portions, which are opposite to each other, corresponding to positions of the second alignment marks 538a and 538b. The first image processors 520a and 520b capture images of the first alignment marks 546a and 546b and the second alignment marks 538a and 538b, to compare the images of the first alignment marks 546a and 546b and the second alignment marks 538a and 538b. The first image processors 520a and 520b determine whether the mask 540 and the blind 530 are disposed in the alignment position for the exposure process, by determining if the first alignment marks 546a and 546b overlap with the second alignment marks 538a and 538b in the third direction D3.

The first image processors 520a and 520b may determine that the blocking plate 532 is out of the alignment position and determine the tilting angle of the blocking plate 532. The first image processors 520a and 520b respectively determine the overlap of the first alignment marks 546a and 546b with the second alignment marks 538a and 538b, from a view point above the end portions of the blocking plate 532. The first image processors 520a and 520b may determine a distance from the alignment position and a degree of inclination of the blocking plate 532, with respect to the desired direction (i.e. the angle of alignment). Accordingly, a compensating distance and a compensating tilting angle of the blocking plate 532 may be calculated using the distance from the alignment position and the degree of inclination.

The exposure apparatus 1000 may further include a controller (not shown) to control the adjusting part 534 and the driver 550, based on signals of the first image processor 520a and 520b. The first image processor 520a and 520b may provide an information signal based on the above determination to the controller. If the first alignment marks 546a and 546b do not overlap the second alignment marks 538a and 538b, the controller controls the adjusting part 534 and the driver 550 based on the information signal.

For example, the controller receives the information signal from the first image processors 520a and 520b. The controller calculates the compensating distance and the compensating tilting angle based on the information signal. The controller controls the adjusting part 534 and the driver 550. The driver 550 moves the blocking plate 532 in the first direction D1 to compensate a position of the blocking plate 532. The adjusting part 534 adjusts the tilting angle of the blocking plate 532, under the control of the controller. Thus, based on the above operations, the first alignment marks 546a and 546b respectively overlap the second alignment marks 538a and 538b, thereby causing the mask 540 and the blind 530 to be aligned in the alignment position.

The second image processor 560 is disposed under the substrate 2000 and the mask 540. The second image processor 560 reads a pattern formed on the substrate 2000 to correct alignment between the substrate 2000 and the mask 540.

The mask and the blocking plate respectively include alignment marks. The first image processor determines whether the alignment marks overlap with each other, to align the mask and the blocking plate in the alignment position before the exposure process. Thus, the difference of positions of the tail patterns on the substrate, due to the tilting angle of the blocking plate may be minimized. Accordingly, a stain, due to an increase of a gap between cells on the substrate may be prevented. In addition, because the mask and the blocking plate may be aligned by the alignment marks of the mask and the blocking plate, a processing efficiency may be improved, and processes may be simplified. In addition, the adjusting part is disposed at an end portion of the blocking plate, and the tilting angle of the blocking plate may be effectively adjusted, so that the blocking plate may be disposed in a desired position and a desired direction.

Figure 4:
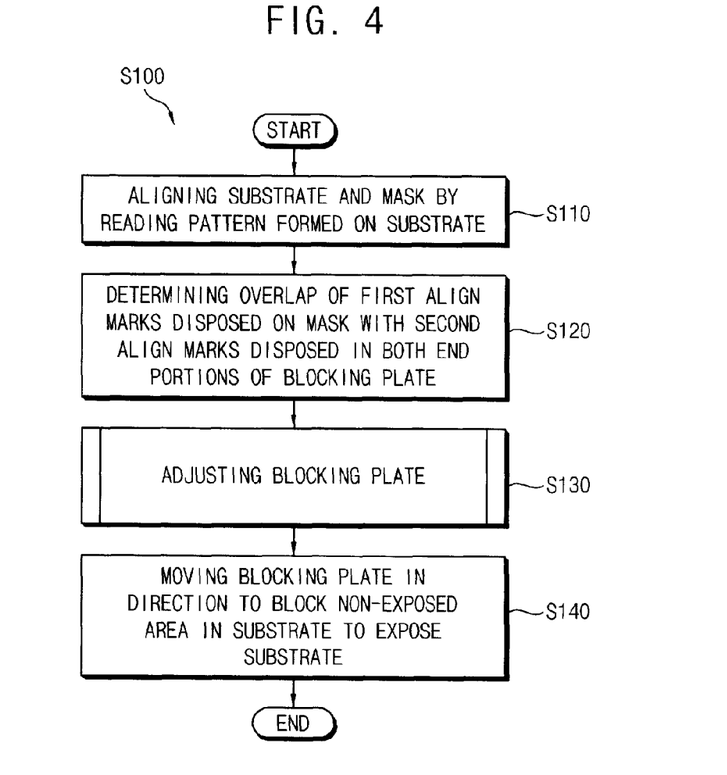
FIG. 4 is a flowchart diagram illustrating a method for driving, according to an exemplary embodiment of the present invention.
Figure 5:
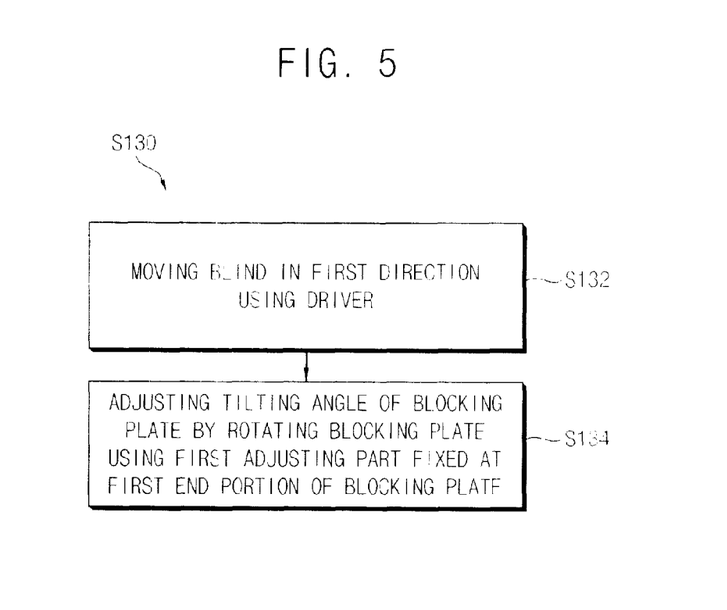
FIG. 5 is a flowchart diagram illustrating a method for adjusting a blocking plate, according to an exemplary embodiment of the present invention.

FIG. 4 is a flowchart diagram illustrating a method for driving the exposure apparatus 1000 of FIG. 1, according to an exemplary embodiment of the present invention. FIG. 5 is a flowchart diagram illustrating a method for adjusting the blocking plate 532 in the method of driving the exposure apparatus 1000 of FIG. 4, according to an exemplary embodiment of the present invention.

Referring to FIGS. 1, 2, 4 and 5, the method (S100) of driving the exposure apparatus 1000 includes aligning the substrate 2000 and the mask 540 by reading a pattern formed on the substrate 2000 (operation S110), determining an overlap of the first alignment marks 546a and 546b with the second alignment marks 538a and 538b (operation S120), adjusting the blocking plate 532 (operation S130), and moving the blocking plate 532 in a direction to block the non-exposed area in the substrate 2000 to expose the substrate 2000 (operation S140).

In order to align the substrate 2000 and the mask 540 (operation S110), the second image processor 560, which is disposed under the substrate 2000 and the mask 540 reads the pattern on the substrate 2000. The second image processor 560 determines if the read pattern on the substrate 2000 and the read pattern on the mask 540 are aligned, and corrects an alignment of the substrate 2000 and the mask 540, based on this determination.

After operation S110, the first image processors 520a and 520b determines if the first alignment marks 546a and 546b are aligned with the second alignment marks 538a and 538b (operation S120). The first image processors 520a and 520b, which are disposed over the blind 530, determine whether the first and second alignment marks 546a, 546b, 538a and 538b are overlapped with each other in the third direction D3. The first image processors 520a and 520b capture the images of the first alignment marks 546a and 546b and the second alignment marks 538a and 538b, in order to compare the first alignment marks 546a and 546b and the second alignment marks 538a and 538b. The first image processors 520a and 520b determine whether the first alignment marks 546a and 546b overlap with the second alignment marks 538a and 538b. The first image processors 520a and 520b may determine that the blocking plate 532 is out of the alignment position and determine a distance from the alignment position and a degree of inclination of the blocking plate 532, with respect to the desired direction. Accordingly, a compensating distance and a compensating tilting angle of the blocking plate 532 may be calculated, using the distance from the alignment position and the degree of inclination.

Based on the result of the above determination, the driver 550 and the adjusting part 534 adjust the blocking plate 532 (operation S130). The driver 550 moves the blind 530 in the first direction D1 (operation S132). The driver 550 moves the blind 530 by the calculated compensating distance in the first direction D1.

The adjusting part 534 rotates the blocking plate 532 to adjust the tilting angle of the blocking plate 532 (step S134). If the blocking plate 532 is inclined by the tilting angle with respect to a direction perpendicular to the first direction D1, the adjusting part 534 compensates the tilting angle.

The blind 530 is moved in the first direction D1 by the driver 550 (operation S132), and the tilting angle of the blocking plate 532 is compensated by the adjusting part 534 (operation S134). Thus, the first alignment marks 546a and 546b respectively overlap the second alignment marks 538a and 538b, thereby allowing the mask 540 and the blind 530 to be aligned substantially in the alignment position. After operation S130, the blocking plate 532 is moved to block the non-exposed area in the substrate 2000 and to expose the substrate 2000 (operation S140).

The mask and the blocking plate each include alignment marks. The first image processor determines whether the alignment marks overlap with each other, and if not, a correlation factor based on the determination of the first image processor is used to align the mask and the blocking plate in the alignment position, before the exposure process. Thus, the difference of positions of the tail patterns on the substrate due to the tilting angle of the blocking plate, may be minimized. Accordingly, a stain due to an increase of a gap between cells on the substrate may also be prevented. In addition, because the mask and the blocking plate may be aligned by the alignment marks of the mask and the blocking plate, a processing efficiency may be improved, and simplified.

In addition, the adjusting part is disposed at an end portion of the blocking plate and the tilting angle of the blocking plate may be effectively adjusted, so that the blocking plate may be easily disposed in a desired position and a desired direction.

Figure 6:
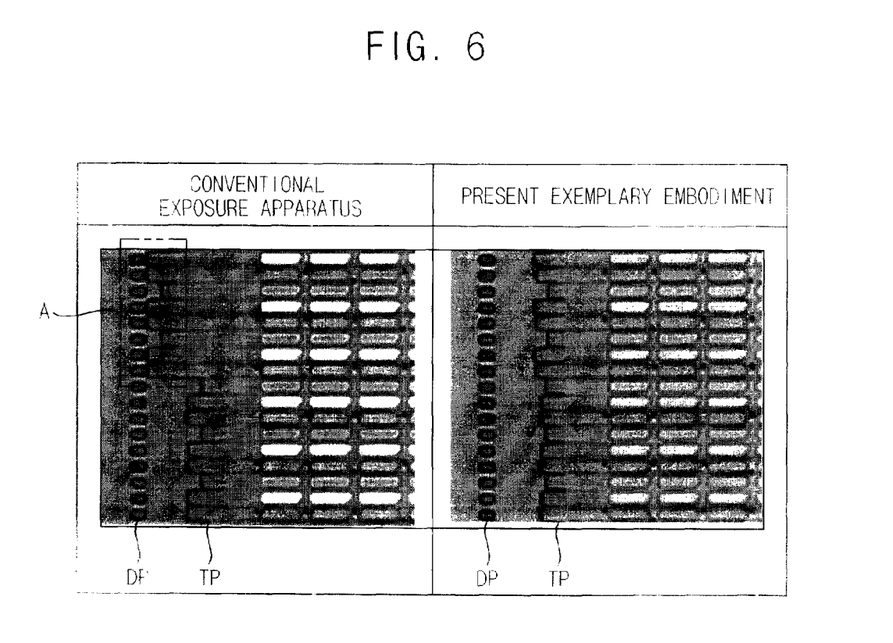
FIG. 6 is an image comparing a tail pattern on a substrate based on a conventional exposure apparatus versus a tail pattern produced, according to an exemplary embodiment of the present invention.

FIG. 6 is an image comparing a tail pattern on the substrate 2000 with a tail pattern produced by a conventional exposure apparatus.

Referring to FIG. 6, positions and lengths of the conventional tail patterns (TP) were irregular, and specifically, differences of the positions and lengths of the tail patterns TP were relatively large. In addition, some of the tail patterns TP overlap with a dummy pattern (DP), at a region A. Due to the overlap of the tail pattern TP with the dummy pattern DP, a gap between cells on the substrate 2000 may be increased, so that a stain may be displayed to a user. In contrast, referring to an image of the present exemplary embodiment, positions and lengths of the present tail patterns TP on the substrate 2000 were more regular, and specifically, differences of the positions and lengths of the tail patterns TP were relatively small. In addition, the tail patterns TP were not overlapped with the dummy pattern DP on the substrate 2000. Thus, a stain on the substrate 2000 may be prevented and/or reduced.

Figure 7:
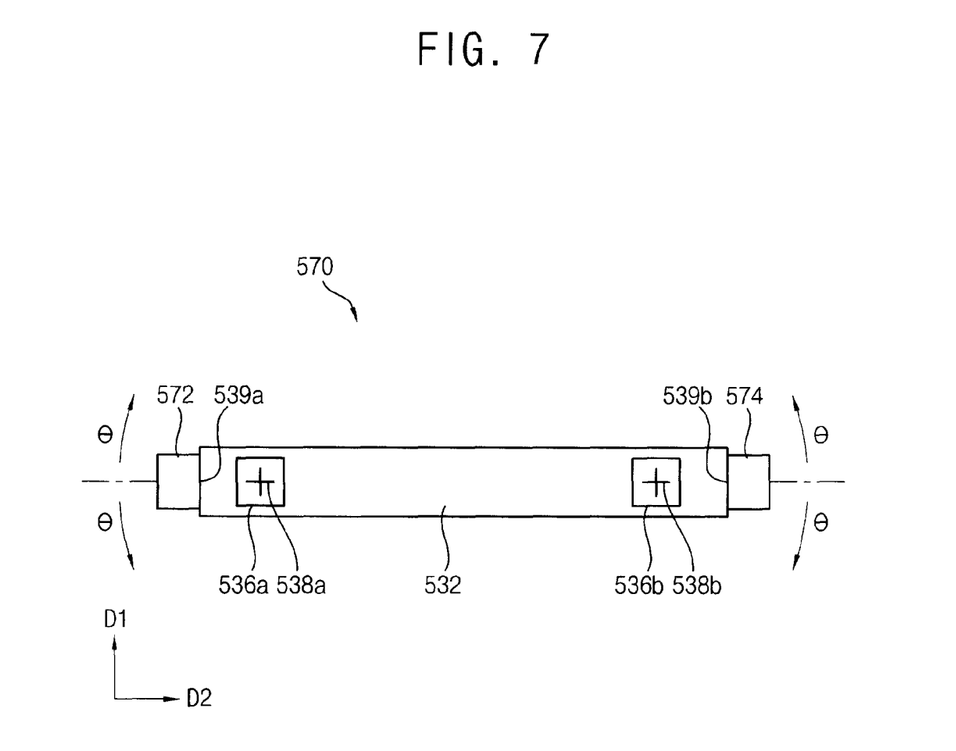
FIG. 7 is a plan view illustrating a blind of the exposure apparatus, according to an exemplary embodiment of the present invention.

FIG. 7 is a plan view illustrating a blind 570 of the exposure apparatus 1000 according to another exemplary embodiment of the present invention. The exposure apparatus according to the present exemplary embodiment is substantially the same as the exposure apparatus 1000, except for the positions of adjustment parts of the blind 570. Thus, only the differences there between will be described in detail.

Referring to FIG. 7, first and second adjusting parts 572 and 574 are fixed at opposing end portions of the blocking plate 532. The first and second adjusting parts 572 and 574 adjust a position of the blocking plate 532. The first adjusting part 572 is fixed at a first end portion 539*a* and a second adjusting part 574 is fixed at an opposing second end portion 539*b*. The first and second adjusting parts 572 and 574 may be driven individually. The first and second adjusting parts 572 and 574 respectively rotate the blocking plate 532, to adjust the tilting angle of the blocking plate 532.

If the blocking plate 532 is perpendicular to the first direction D1 at the alignment position, the blocking plate 532 may block the light radiated from the light source 510 in an allowable error range, and the difference of positions of tail patterns on the substrate 2000 may be minimized, so that an overlap of a dummy pattern with the tail pattern on the substrate 2000 may be prevented. However, before the exposure process, the blocking plate 532 may be inclined from the first direction D1. If the blocking plate 532 is inclined, a range of the tail pattern may be increased and the dummy pattern and the tail pattern may be overlapped with each other. Accordingly, a gap between cells on the substrate 2000 may be increased, so that a stain may be displayed to a user. As explained above, the first and second adjusting parts 572 and 574 adjust the tilting angle of the blocking plate 532. Accordingly, the tilting angle of the blocking plate 532 is adjusted to be in a desired direction so that the difference of positions of the tail patterns on the substrate 2000 may be minimized. In addition, the first and second adjusting parts 572 and 574 are provided, so that the tilting angle may be adjusted with more control than when using a single adjusting part. The method of driving the exposure apparatus using two adjusting parts is substantially the same as the method for driving the exposure apparatus 1000 using a single adjusting part, except that adjustment parts of the blind 570 are disposed at opposing end portions of the blocking plate.

As explained above, according to the present invention, alignment marks are formed on a mask and a blocking plate, and the mask and the blocking plate are aligned at an alignment position by an image processor which detect the alignment marks of the mask and the blocking plate, thereby reducing the difference between positions and sizes of tail patterns on the substrate due to a tilting angle of the blocking plate.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An exposure apparatus comprising:
a light source to cyclically radiate light onto a substrate;
a mask disposed between the light source and the substrate, the mask comprising a patterned exposure region, a peripheral region surrounding the exposure region, and first alignment marks disposed on the peripheral region;
a blind disposed between the light source and the mask, the blind comprising a blocking plate, and an adjusting part to adjust the position of the blocking plate;
a driver configured to move the blind;
a first image processor configured to determine the relative alignment of the blocking plate and the mask; and
a controller configured to control the driver and the adjusting part, based on the alignment determination of the first image processor,
wherein the blocking plate moves from a first end of the substrate to an opposing second end of the substrate and comprises second alignment marks disposed at opposing first and second ends of the blocking plate, and
wherein the adjusting part comprises a first adjusting part fixed at a first end of the blocking plate and the first adjusting part is configured to rotate the blocking plate to adjust the tilt angle of the blocking plate.

2. The exposure apparatus of claim 1, wherein:
the blocking plate comprises a first transparent window and a second transparent window; and
the second alignment marks are disposed in the first and second transparent windows.

3. The exposure apparatus of claim 1, wherein the first alignment marks are disposed at a first end of the mask, and the first end of the mask is disposed at the first end of the substrate.

4. The exposure apparatus of claim 1, wherein the first image processor is configured to determine the alignment via detection of an amount of overlap between the first alignment marks and the second alignment marks, in a direction perpendicular to the substrate.

5. The exposure apparatus of claim 1, wherein the blind comprises a plurality of the blocking plates.

6. The exposure apparatus of claim 1, wherein the adjusting part comprises a second adjusting part fixed at a second end of the blocking plate, the second end opposing the first end, and the second adjustment part is configured to rotate the blocking plate to adjust the tilt angle of the blocking plate.

7. The exposure apparatus of claim 1, further comprising a stage to move the substrate.

8. The exposure apparatus of claim 1, further comprising a second image processor to align the substrate and the mask, based on a reading of a pattern formed on the substrate.

9. A method of driving an exposure apparatus, the method comprising:
positioning a blocking plate with a driver;
overlapping a mask and the blocking plate over a substrate;
determining the relative alignment of the blocking plate and the mask, by comparing the relative positions of first alignment marks disposed on the mask and second alignment marks disposed on the blocking plate, wherein the determining comprises using first image processors disposed over opposing end portions of the blocking plate, to determine the overlap of the first and second alignment marks, in a direction perpendicular to the substrate;

providing relative alignment signals to a controller;

adjusting the blocking plate via signals from the controller based on the comparison; and moving the blocking plate with the driver under control of the controller, so as to block a non-exposed area of the substrate, wherein the adjusting the blocking plate comprises:
   moving the blocking plate from a first end of the mask toward an opposing second end of the mask; and
   adjusting a tilt angle of the blocking plate by rotating the blocking plate disposed at a first end of the blocking plate.

10. The method of claim 9, wherein the adjusting the tilt angle further comprises rotating the blocking plate using a second adjusting part disposed at an opposing second end of the blocking plate.

* * * * *